US006529412B1

(12) United States Patent
Chen et al.

(10) Patent No.: US 6,529,412 B1
(45) Date of Patent: Mar. 4, 2003

(54) SOURCE SIDE SENSING SCHEME FOR VIRTUAL GROUND READ OF FLASH EPROM ARRAY WITH ADJACENT BIT PRECHARGE

(75) Inventors: Pau-Ling Chen, Saratoga, CA (US); Michael A. Van Buskirk, Saratoga, CA (US); Yu Sun, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/050,257

(22) Filed: Jan. 16, 2002

(51) Int. Cl.[7] ............................................. G11C 16/00
(52) U.S. Cl. ............................. 365/185.21; 365/185.16
(58) Field of Search ..................... 365/185.21, 185.16, 365/185.17, 185.18

(56) References Cited

U.S. PATENT DOCUMENTS

| 5,448,518 | A | * | 9/1995 | Jinbo | 365/185.06 |
| 5,517,448 | A | * | 5/1996 | Liu | 365/185.11 |
| 6,134,156 | A | | 10/2000 | Eitan | 365/189.07 |
| 6,191,976 | B1 | | 2/2001 | Smayling et al. | 365/185.2 |
| 6,195,287 | B1 | | 2/2001 | Hirano | 365/185.18 |
| 6,201,737 | B1 | | 3/2001 | Hollmer et al. | 365/185.16 |

* cited by examiner

*Primary Examiner*—Tan T. Nguyen
(74) *Attorney, Agent, or Firm*—Eschweiler & Associates, LLC

(57) ABSTRACT

A system is disclosed for producing an indication of the logical state of a flash memory cell for virtual ground flash memory operations. The system comprises a bit line precharge and hold circuit which is operable to apply and maintain a source terminal voltage (e.g., about 0 volts, ground) to a bit line associated with the source terminal of a cell adjacent to the cell which is sensed during a read operation, wherein the applied source terminal voltage is substantially the same as the bit line virtual ground voltage applied to the source terminal bit line of the selected memory cell to be sensed. The system also includes a drain bit line circuit operable to generate a drain terminal voltage for a drain terminal of a selected memory cell to be sensed. The system further includes a selective bit line decode circuit which is operable to select the bit lines of a memory cell to be sensed and the bit line of an adjacent cell, and a core cell sensing circuit which is operable to sense a core cell sense current at a bit line associated with a source terminal of the selected memory cell to be sensed during memory read operations, and produce an indication of the flash memory cell logical state, which is substantially independent of charge sharing leakage current to an adjacent cell.

15 Claims, 10 Drawing Sheets

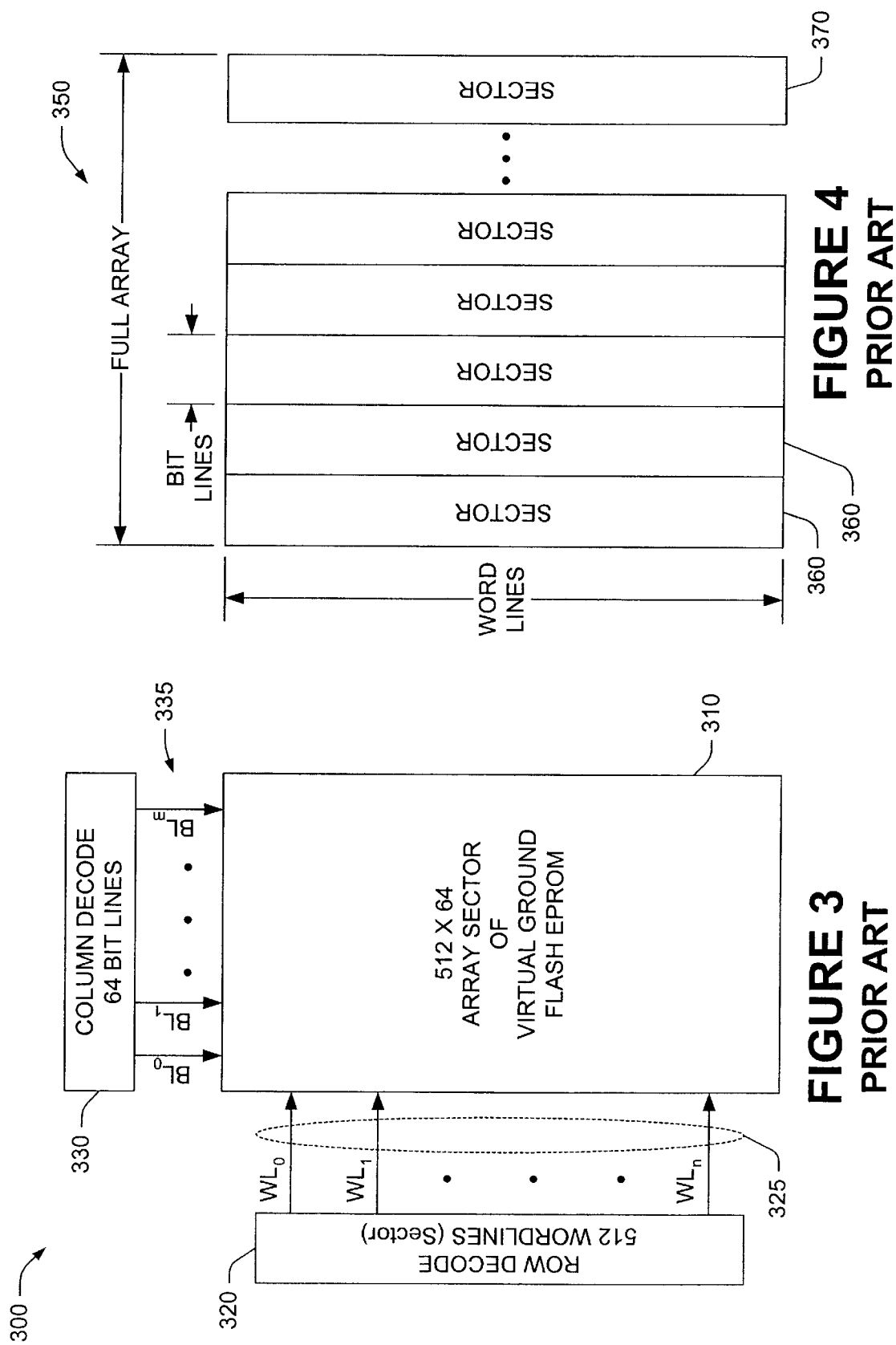

SOURCE SIDE SENSING SCHEME FOR VIRTUAL GROUND READ OF FLASH EPROM ARRAY WITH ADJACENT BIT PRECHARGE

FIELD OF INVENTION

The present invention relates generally to memory systems and in particular, to virtual ground flash EPROM memory array systems and methods to eliminate the effects of charge sharing leakage currents to adjacent bits and loss in transient sense current during memory cell current read operations, resulting in substantially improved signal margins.

BACKGROUND OF THE INVENTION

Flash and other types of electronic memory devices are constructed of thousands or millions of memory cells, adapted to individually store and provide access to data. A typical memory cell stores a single binary piece of information referred to as a bit, which has one of two possible states. The cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry, whereby such operations may be performed on the cells within a specific byte or word. The individual memory cells are typically comprised of a semiconductor structure adapted for storing a bit of data. For instance, many conventional memory cells include a metal oxide semiconductor (MOS) device, such as a transistor in which a binary piece of information may be retained. The memory device includes appropriate decoding and group selection circuitry to address such bytes or words, as well as circuitry to provide voltages to the cells being operated on in order to achieve the desired operation.

The erase, program, and read operations are commonly performed by application of appropriate voltages to certain terminals of the cell MOS device. In an erase or program operation the voltages are applied so as to cause a charge to be stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access to other devices in a system in which the memory device is employed.

Flash memory is a type of electronic memory media which can be rewritten and hold its content without power. Flash memory devices generally have life spans from 100K to 1 MEG write cycles. Unlike dynamic random access memory (DRAM) and static random access memory (SRAM) memory chips, in which a single byte can be erased, flash memory is typically erased and written in fixed multi-bit blocks or sectors. Conventional flash memories are constructed in a cell structure wherein a single bit of information is stored in each flash memory cell. In such single bit memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

FIG. 1 illustrates a typical NOR configuration 100, wherein the control gate 110 is connected to a wordline (e.g., WL0 thru WL3) associated with a row of such cells 120 to form sectors of such cells. In addition, the drain regions 130 of the cells are connected together by a conductive bitline (e.g., BL0 thru BL3). The channel of the cell conducts current between the source 140 and the drain 130 in accordance with an electric field developed in the channel by the stacked gate structure. In the NOR configuration, each drain terminal 130 of the transistors 120 within a single column is connected to the same bitline. In addition, each flash cell 120 associated with a given bit line has its stacked gate terminal 110 coupled to a different wordline (e.g., WL1 thru WL4), while all the flash cells in the array have their source terminals 140 coupled to a common source terminal (CS). In operation, individual flash cells 120 are addressed via the respective bitline and wordline using peripheral decoder and control circuitry for programming (writing), reading or erasing functions.

Such a single bit stacked gate flash memory cell is programmed, for example, by applying a relatively high voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. The voltage at the drain in conventional stacked gate memory cells is typically provided at between 1.0 and 1.5 volts in a read operation. A voltage is then applied to the gate (e.g., the wordline) of the memory cell transistor in order to cause a current to flow from the drain to source. The read operation gate voltage is typically applied at a level between a programmed threshold voltage ($V_T$) and an unprogrammed threshold voltage. The resulting current is measured, by which a determination is made as to the data value stored in the cell.

In addition to the NOR configuration, some prior art flash memories also use a "virtual ground" architecture, as shown in FIG. 2. A typical virtual ground architecture 200 comprises rows 240 of flash cells 210 with its stacked gate terminal 215 coupled to an associated wordline (e.g., $WL_0$ thru $WL_n$) 240, and columns (260, 270, 280, 290) of flash cell pairs (210 & 230) with a drain 235 of one transistor 230 coupled to an associated bitline (e.g., $BL_0$ thru $BL_m$) and the source 220 of the adjacent transistor 210 coupled to the same bitline 270. In addition, each single row of flash cells (e.g., 210 & 230) associated with a wordline 240 is connected in series, with the source 220 of one cell 210 coupled to the drain 235 of an adjacent cell 230, wherein each drain terminal of the transistors within a single column is connected to the same bitline.

An individual flash cell is selected via the wordline and a pair of bitlines bounding the associated cell. For example, in reading the flash cell 210, a conduction path would be established when a positive voltage is applied to the bitline ($BL_0$) 260 coupled to the drain of flash cell 210, and the source 220 which is coupled to the bitline ($BL_1$) 270, is selectively coupled to ground ($V_{SS}$). Thus, a virtual ground is formed by selectively switching to ground the bitline associated with the source terminal of only those selected flash cells which are to be programmed or read.

FIG. 3 illustrates that just as with the NOR configuration, the typical prior art virtual ground flash memory array sector 300 comprises both row decode logic circuits 320 for selecting one or more wordlines 325, and column decode logic circuits 330 for selecting one or more bitlines 335. The array sector of flash cells 310, for example, comprises 512 rows and 64 columns of memory cells, which are associated with 512 wordlines and 64 bitlines, respectively.

As shown in FIG. 4, a conventional prior art full array 350, may contain 16 such sectors (360 and 370) with associated wordline and bitline decode logic.

A typical prior art flash memory circuit configuration is shown in FIG. 5. The prior art virtual ground flash memory circuit 400, comprises both row decode logic circuits 420 for selecting one or more wordlines 435, and column decode logic circuits 450 for selecting one or more bitlines 445. The array of flash cells 440, also comprises one or more sectors (e.g., 512 rows and 64 columns) of memory cells, which are associated with an equivalent number of wordlines and bitlines. Alternately, bitlines in some virtual ground architecture implementations of column decode logic circuits are decoded in pairs, to select two or more bitlines at a time (e.g., the bitlines bordering a cell to be read).

In addition, various methods of sensing the logical state of the memory cell may be employed. Two of these methods will be discussed, they are a drain-side sensing scheme, and a source-side sensing scheme, respectively. Simply, the difference in these two sensing schemes is the particular side of the cell in which the associated bitline sensing circuitry resides. For example, in the drain-side sensing scheme the sensing circuitry is coupled to the bitline associated with the drain terminal of the cell to be sensed, while in the source-side sensing scheme the sensing circuitry is coupled to the bitline associated with the source terminal of the cell to be sensed. Either the drain-side or the source-side sensing circuits may also use, for example, a series current, a current mirror, or any other type of sensing configuration to the associated bitline. Initially the drain-side sensing will be discussed.

FIG. 5, for example, comprises drain-side sensing circuitry to read the flash cells of the prior art virtual ground circuit 400, which contains a Global precharge circuit 460 which precharges all the bitlines of one or more sectors of the array with the same positive voltage $V_D$ (e.g., about 1.2 volts) 445, as is used to sense the flash cell current via a cascode current-to-voltage preamplifier circuit 470. The cascode preamplifier circuit 470 supplies the positive voltage $V_D$ generated from the $V_{CC}$ 415 to a bitline on the drain side of the selected flash cell within the array 440, while the source side of the selected cell is coupled thru another bitline to the ground 480 via the virtual ground switch circuitry 490 to generate a core cell sense current $I_{CORE}$ 475. The cascode preamplifier circuit 470, converts the core cell sense current $I_{CORE}$ 475 to a core cell sense voltage $V_{CORE}$ 477 for use in a sense amplifier 476. The cascode preamplifier 470 also generates a reference current $I_{REF}$ and converts this to a reference voltage $V_{REF}$ 478, which is compared to $V_{CORE}$ 477 in the sense amplifier 476.

During reading, this sense voltage $V_{CORE}$ 477 associated with the flash cell sense current $I_{CORE}$ 475, is compared to the reference voltage $V_{REF}$ 477 in the sense amplifier 476 to produce a core cell verification indication 479 that the correct flash cell logical state is stored at the desired location.

FIG. 6 shows a method 500 and four basic steps (510, 520, 530, 540) which are employed to read conventionally a selected flash cell in the prior art virtual ground circuit of FIG. 5. Initially, in a step 510 which begins at time $t_0$, all bitlines ($BL_O$ thru $BL_M$) are first precharged to the same positive voltage $V_D$ (e.g., about 1.2 volts) as is used to sense the flash cell current. By a time $t_1$ 520, the bitlines are assumed to be precharged to a positive voltage $V_D$. The global precharge circuit voltage $V_D$, is then disconnected from all the bitlines at time $t_1$ 520, and the bitlines are allowed to float without an applied voltage. At time $t_2$ 530, a core cell 535 is selected with a bitline $BL_X$ 536 at the drain side of the cell, and with an adjacent bitline $BL_{X+1}$ 545 at the source side of the cell; and a wordline $WL_X$ coupled to the gate of the cell 535 to be sensed, while all other bitlines continue to float. Also during this step, the bitline $BL_{X+1}$ 545 is selectively coupled as a virtual ground to ground 547. At time $t_3$ 540, the flash cell 535 sensing operation 548 begins with the application of a wordline voltage at $WL_X$, a bitline voltage $V_D$ at 536 to the drain, and a ground 547 to the source 545 of the selected flash cell 535.

Thus, an individual flash cell is selected via a wordline and a pair of bitlines bounding the associated cell. For example, in reading a flash cell of the sector of FIG. 6, a conduction path is established when a positive voltage $V_D$ is applied to one of the bitlines (e.g., $BL_X$) 536 coupled to the drain of a flash cell, the source of the flash cell is coupled to an adjacent bitline (e.g., $BL_{X+1}$) 545, which is selectively coupled to ground ($V_{SS}$) 547, and an appropriate wordline (e.g., $WL_X$) voltage is applied to the gate of the selected cell.

With a current established in the selected core cell, the core cell sense current 548 is converted to a cell sense voltage $V_{CORE}$ within the cascode current-to-voltage preamplifier circuit along with a reference cell voltage $V_{REF}$ which is passed to a sense amplifier (e.g., 476 of FIG. 5) to produce a core cell verification indication (e.g., 479 of FIG. 5) of the correct logical state of the flash core cell.

A drawback of the conventional method is best seen as in the global bitline voltage versus time plot 550 of prior art FIG. 7, and the core cell Sense current versus time plot 570 of prior art FIG. 8. As the global precharge of all the bitlines begins at time $t_0$ 555 in FIG. 7, the voltage on all the bitlines rapidly charges along line segment 560 toward the applied positive voltage $V_D$ (e.g., about 1.2 volts) 562. $V_D$ is briefly maintained on all the bitlines until time $t_1$ 556 at which point $V_D$ is disconnected from all the bitlines. After the precharge time to 555, and before the core cell select time $t_2$ 557, the voltage $V_D$, which was applied globally to all the bitlines of one or more sectors, is allowed to float, and therefore discharges along the exemplary curve segment 563 to a lower voltage due to the leakage of the cells coupled to the selected wordline. The amount of time that this positive voltage $V_D$ will remain on the bitlines after $V_D$ is disconnected, is an RC function of the combined distributed capacitance of all the cells on the wordline, and the total leakage of all the individual cell leakages along each bitline. The source of this cell leakage current is a result of the sharing of the charge between all the associated cells (called charge sharing), and the material properties of the semiconductor structures.

Also, since all the cells associated along a wordline have their drains and sources coupled in series, these cells have a combined leakage path through the drain side of the cell being sensed. If a cell was selected, for example, at the end of the wordline, there could be as many as 64 cells combined leakage seen at the drain side of the cell whose current is being sensed.

At time $t_2$ 557, the bitlines bounding the cell to be sensed are selected along with the associated wordline. Upon selection, the flash core cell current $I_{CORE}$ is sensed by the cascode circuit and illustrated with line segment 580 of the cell sense current versus time plot of FIG. 8. The core cell current, however, is also being added to the total leakage current exhibited by all the cells coupled on the selected wordline. In the example 570, the total sensed current $I_{LEAKAGE}+I_{CORE}$ (580) may be greater than the low core cell current $I_{CORE}$, which should be read as a logical "1". With a typical cell sense current set at, for example, about 100 uA (590), for the sense of a logical "0" state, the conventional cascode and sense amplifier circuitry would instead, incorrectly indicate a logical "0" state at 585 at time $t_3$ 558, as a result of the combined core cell current and leakage current.

Referring back to FIG. 7, the bitline voltage has continued to discharge and drop along line segment 563 until at time $t_3$ 558 the selected cell sense current is made. At a sense voltage 568 associated with this cell sense current 590, and point 565 on line segment 563, a voltage drop has been established between the drain of the cell being sensed and the drain of the adjacent drain side cell. The voltage drop induced across the cells increases the leakage currents in those cells, and increases the resultant error in the sense current readings (read signal margins).

Additionally, the voltage drop induced across the cells by the discharging voltage which was applied globally to the bitlines, has a dynamic or variable characteristic as shown in the curves 550 and 570. The dynamic characteristics of the leakage currents makes the cell sense current read operation inconsistent, and degrades the read signal margins. Such sense current variations degrades the ability in the read mode circuitry to discriminate accurately whether or not a cell is programmed.

Although the drain-side sensing scheme has been discussed here, it should be realized that source-side sensing schemes also are subject to leakage to adjacent cells and therefore to errors in read operations in many similar ways. Drain-side sensing has precharge voltages applied directly to the cells adjacent to the sensed cell, which float or discharge to another level thereby causing a differential voltage and a ready leakage path. Source-side sensing also has cells adjacent to the sensed cell which may be floating at some voltage which remains on the cell from a previous memory operation (e.g., read, erase, program) which was performed. For either sensing scheme, therefore, the voltage drop across the adjacent cell at the sensed side of the read cell, represents a path for leakage current and a read sense error.

Accordingly, there is a need for a stable means of eliminating the effects of charge sharing leakage currents to adjacent bits and loss in transient sense current during memory cell current read operations, resulting in substantially improved signal margins in a virtual ground flash EPROM memory array system.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a system and method of eliminating the effects of charge sharing leakage currents to adjacent flash cells and loss of sense current during memory cell current read operations, which result in substantially reduced read errors in a virtual ground flash memory array system.

The present invention provides bitline precharge and hold circuitry, as well as a combination of selective bitline decode circuitry and methodologies by which a precharge voltage may be applied to a specific bitline adjacent to a sensed memory cell during memory read operations, wherein applying a precharge voltage $V_{SS}$ (e.g., about 0 volts, or ground) to the bitline at the source terminal (source side bitline) of the cell adjacent to the source side of the cell being sensed, reduces or cancels the leakage current which is conventionally associated with the adjacent cell.

Leakage current variations in the memory cells are typically reflected in the read sense current output of the memory cell sense amplifier circuit which causes incorrect indications of the memory cell logical states. These reading errors are referred to as "read margins". By applying the substantially same voltage to the adjacent cell source bitline, as is applied to the sensed cell source bitline, a voltage drop across the adjacent cell is substantially eliminated and therefore variations in the read sense current output are avoided. The current output is applied to a source side sensing circuit which produces an associated read sense voltage which is passed to a sense amplifier to produce the memory cell logical state indication. With the current variations due to adjacent cell leakage eliminated, a more consistent memory cell reading is insured. These features are provided by the source-side sensing scheme of the present invention.

A feature of the sensing scheme of the present invention is that fewer bitlines need be precharged, (e.g., only two bitlines are precharged), in contrast to all the bitlines of a sector or all the bitlines of an entire array being charged with conventional sensing schemes.

Another feature of the sensing scheme of the present invention is that a more stable output indication is possible than with conventional schemes by eliminating the dynamic characteristics due to leakage between adjacent cells and variations in the resultant cell sense current, and read signal margins are improved. This feature is particularly advantageous in multibit memory devices, where higher signal margins are needed to differentiate between the threshold distribution regions of each bit.

Yet another feature of the sensing scheme of the present invention is that by eliminating the effects of leakage to adjacent cells, leakage considerations as a part of manufacturing are reduced.

An advantage of the present invention over conventional sensing schemes, is the elimination of the dynamic discharge characteristic of the bitlines and array cells. In addition, the present invention also eliminates the variations of the cell current reading due to the timing of the reading after the cell sense or precharge voltage is disconnected. Thus, timing of the reading does not affect the actual reading.

Thus a memory system is disclosed for producing an indication of the logical state of a flash memory cell for virtual ground flash memory operations, which is substantially independent of charge sharing leakage currents to adjacent cells.

The aspects of the invention find application in devices which include virtual ground memory cells architectures, where memory cell leakages may be higher, and in association with multibit memory devices employed in higher signal margin applications.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3 is a simplified schematic illustration of a prior art virtual ground array of memory cells together with wordline and bitline decode circuitry;

FIG. 4 is a block diagram demonstrating a configuration of a number of memory sectors into a larger memory array;

DETAILED DESCRIPTION OF THE INVENTION

Figure 1:
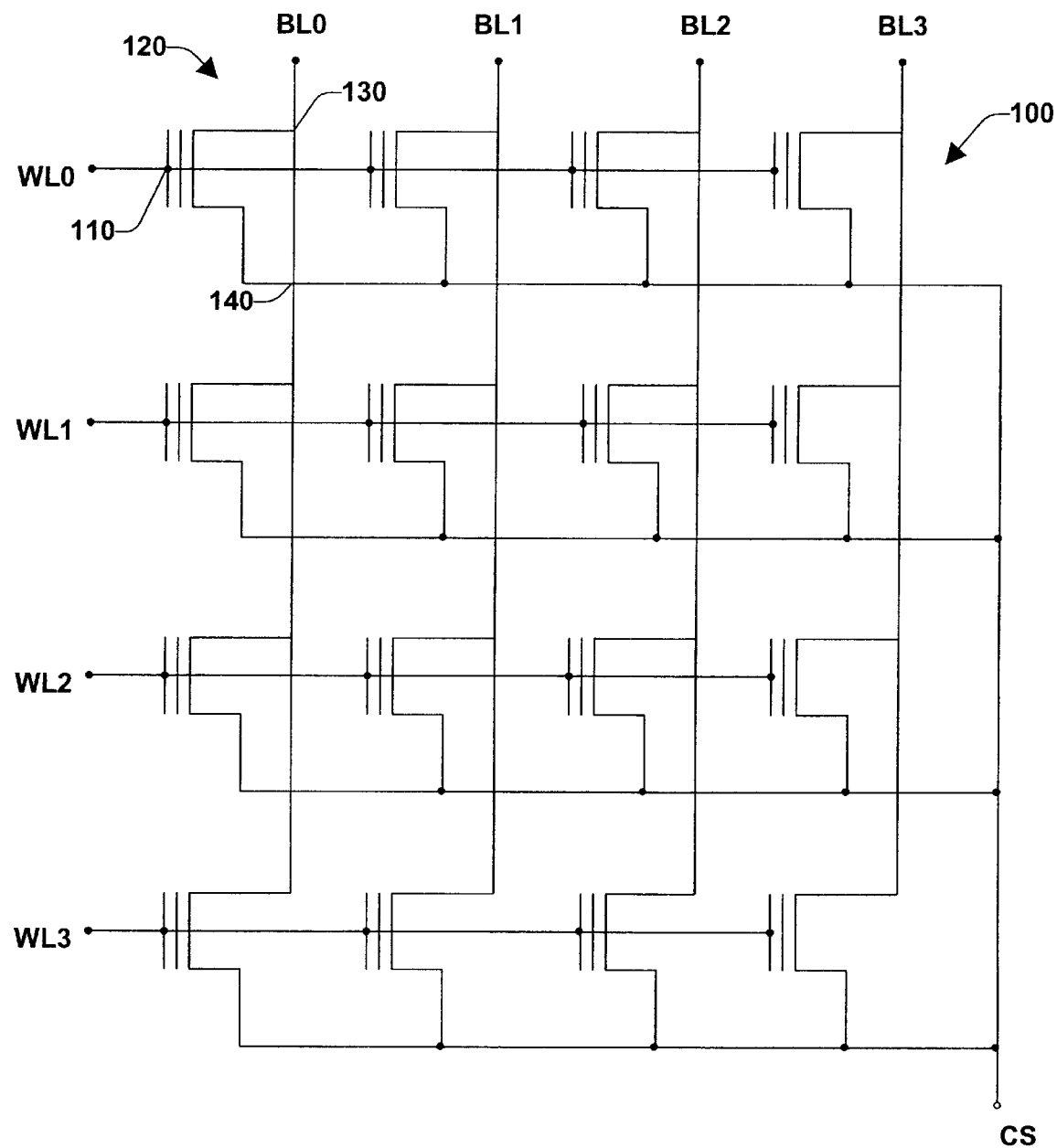
FIG. 1 is a schematic diagram which illustrates a conventional NOR flash memory architecture.
Figure 2:
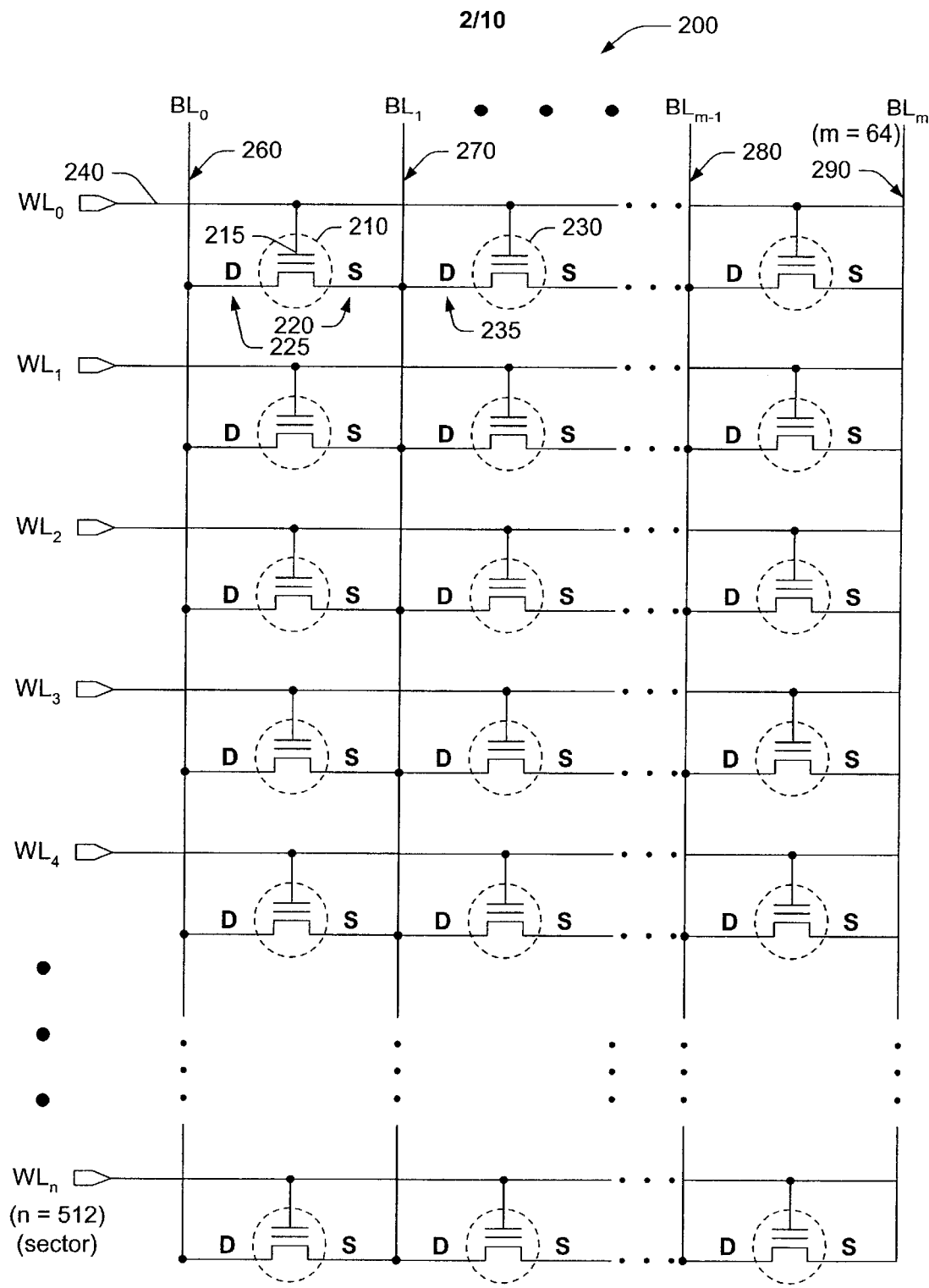
FIG. 2 is a schematic diagram which illustrates a conventional virtual ground flash EPROM memory array.
Figure 5:
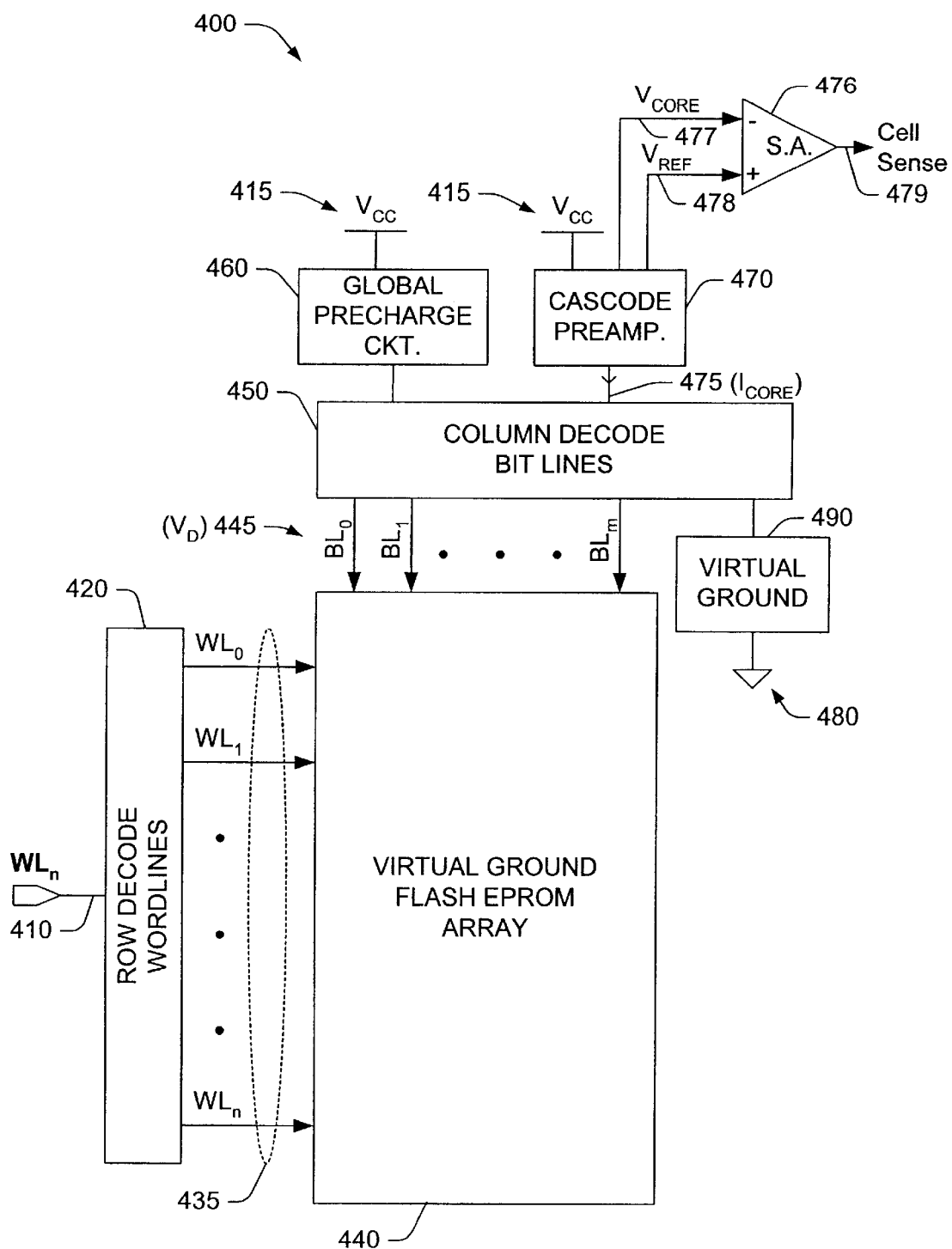
FIG. 5 is a system level functional block diagram illustrating a conventional scheme for indicating the state of a memory cell within a virtual ground array.
Figure 6:
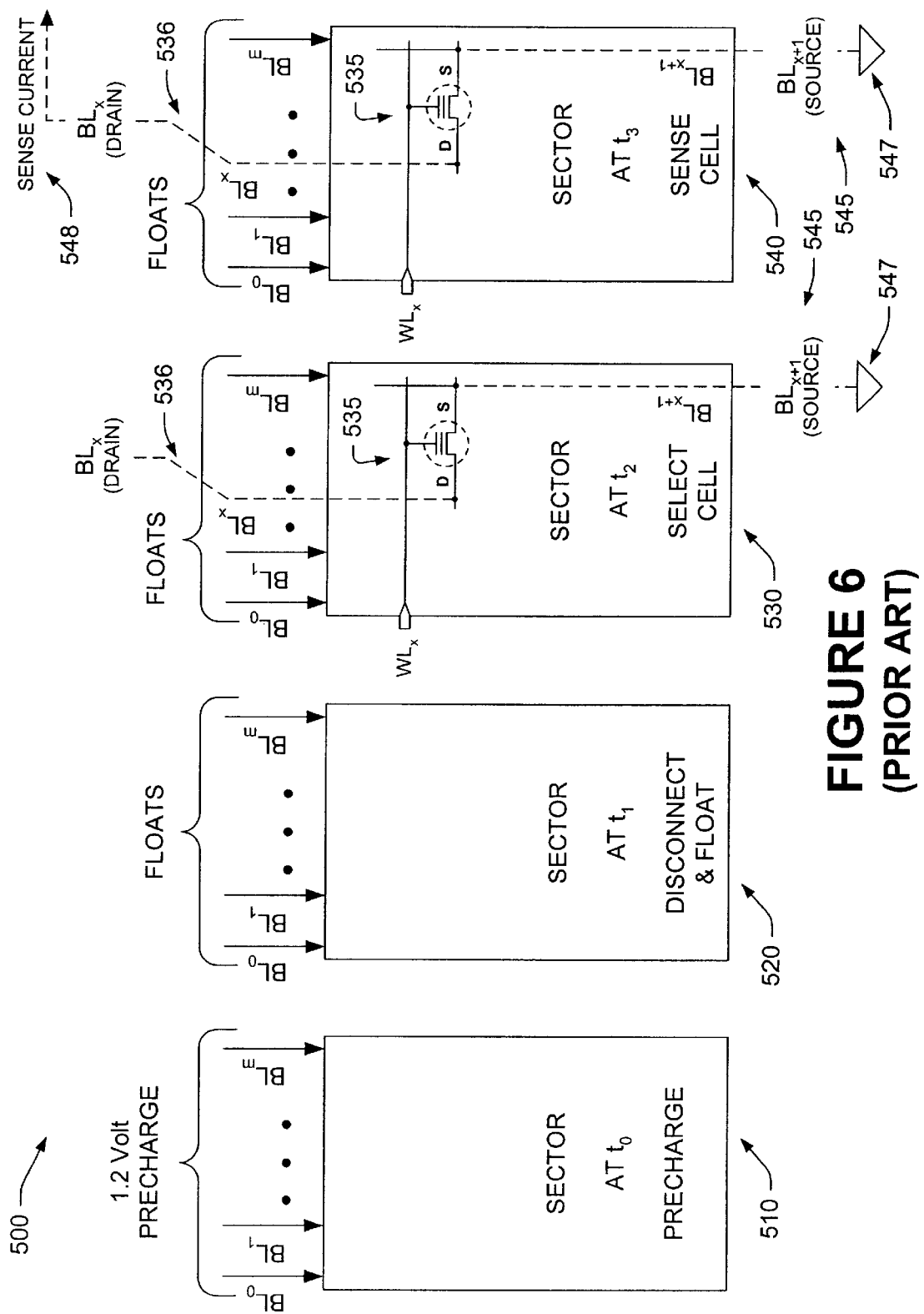
FIG. 6 is a simplified schematic diagram which illustrates four exemplary steps of a conventional scheme for reading the state of a cell in a virtual ground array.
Figure 7:
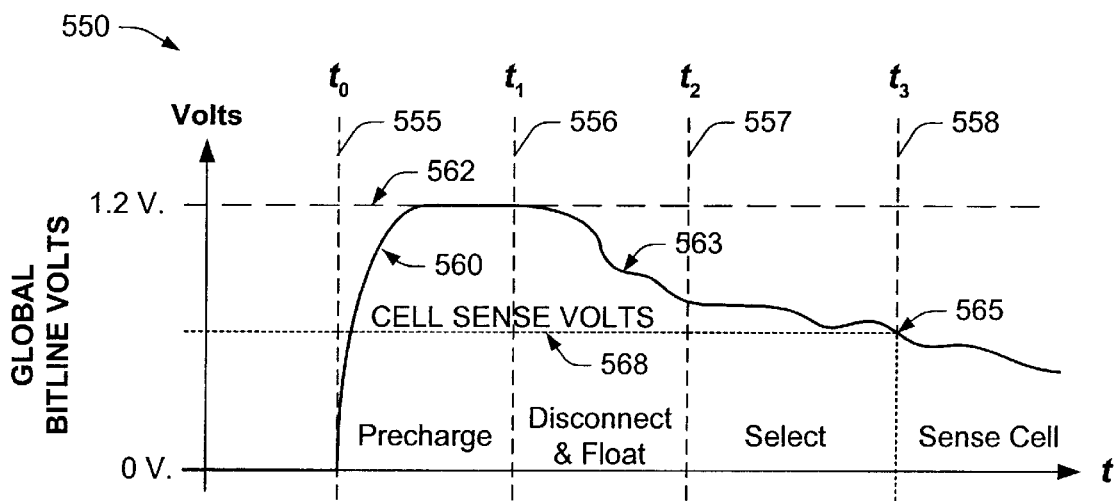
FIG. 7 is a waveform diagram illustrating a global bitline voltage versus time plot illustrating the bitline voltage changes of four exemplary steps of a conventional cell sensing scheme.
Figure 8:
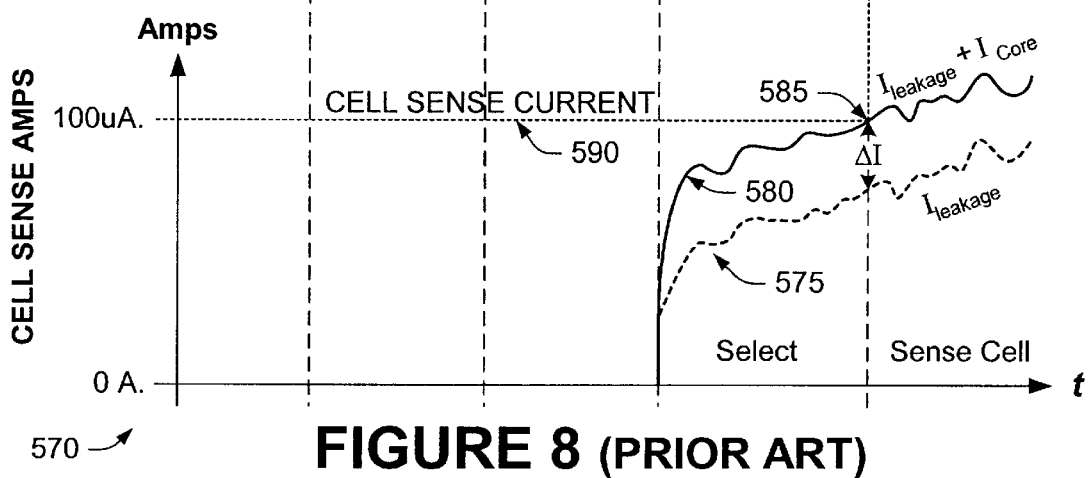
FIG. 8 is a waveform diagram illustrating a cell sense amperage versus time plot illustrating the cell sense current and leakage current changes of four exemplary steps of a conventional cell sensing scheme.

The present invention will now be described with reference to the drawings, wherein like reference numerals are used to refer to like elements throughout. The present invention relates to a virtual ground flash EPROM array circuit and method for producing an indication of the logical state of a flash memory cell for virtual ground flash memory operations. The system comprises a bitline precharge and hold circuit which is operable to apply a precharge voltage $V_{SS}$ (e.g., about 0 volts, or ground) to the source bitline of the cell adjacent to the cell which is sensed, wherein the applied voltage is substantially the same as the voltage (e.g., about 0 volts, or ground) applied to the source bitline of the sensed cell. The system further includes a selective bitline decode circuit which is operable to select the bitlines of a memory cell to be sensed and the bitline of an adjacent cell during memory read operations, wherein applying substantially the same voltage to the bitline of the cell adjacent to the cell being sensed, reduces or cancels the leakage current which is conventionally associated with the adjacent cell. The system also includes a core cell sensing circuit which is operable to generate a core cell sense current from the memory cell, and produce an indication of the flash memory cell logical state, which is substantially independent of charge sharing leakage currents to adjacent cells.

Figure 9:
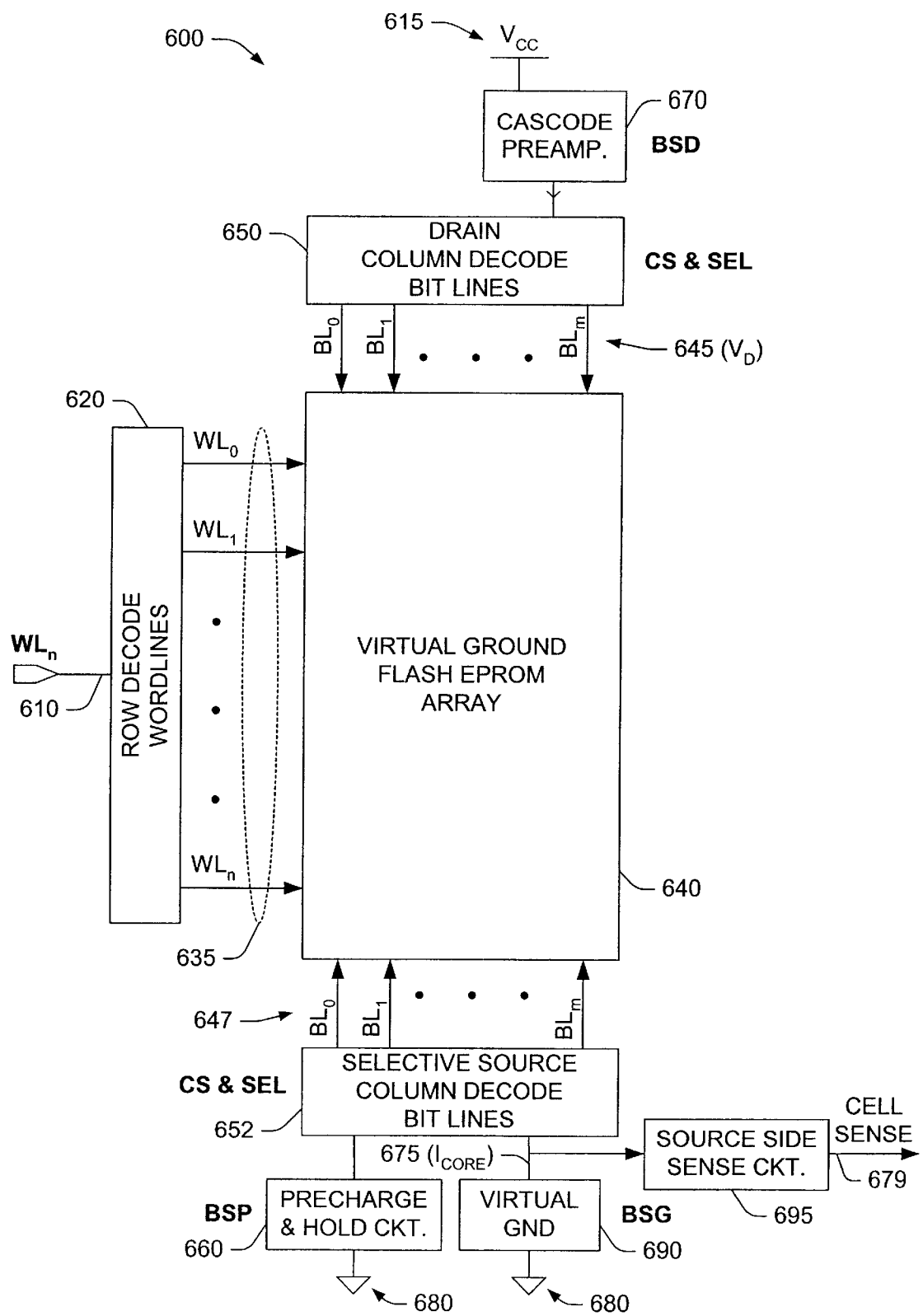
FIG. 9 is a system level functional block diagram illustrating an exemplary system for a source side sensing scheme with adjacent bit precharge, in which various aspects of the invention may be carried out.

Returning to the figures, FIG. 9 is a system level functional block diagram illustrating an exemplary system 600 for the source-side sensing scheme with adjacent bit precharge, in which various aspects of the invention may be carried out.

The exemplary flash memory sensing scheme circuit configuration 600, comprises row decode logic circuitry 620 for selecting one or more wordlines 635, drain column decode logic circuitry 650 for selecting one or more bitlines 645 which are coupled to memory cell drain terminals within the array 640, and selective source column decode logic circuitry 652 for selecting one or more bitlines 647 which are coupled to memory cell source terminals within the array 640. The array of flash cells 640, also comprises one or more sectors (e.g., 512 rows and 64 columns) of memory cells, which are associated with an equivalent number of wordlines and bitlines.

The circuitry to read the flash cells of the virtual ground circuit 600, contains a precharge and hold circuit 660 which precharges only the selected bitlines of one or more sectors of the array with a precharge voltage $V_{SS}$ (e.g., about 0 volts, or ground) 680 which is virtually the same voltage as is applied through the virtual ground circuit 690. The cascode preamplifier circuit 670 supplies a positive voltage $V_D$ (e.g., about 1.2 volts) 645 generated from the $V_{CC}$ 615, via the drain column decode circuit 650 to a bitline on the drain side of the selected flash cell within the array 640. The source side of the selected cell is coupled thru an adjacent source side bitline via the selective source column decode circuit 652 to the ground 680 via the virtual ground switch circuitry 690 to generate a core cell sense current $I_{CORE}$ 675. The source-side sense circuit 695 senses the flash cell current to produce an associated core cell sense indication 679 of the correct flash cell logical state.

Figure 10:
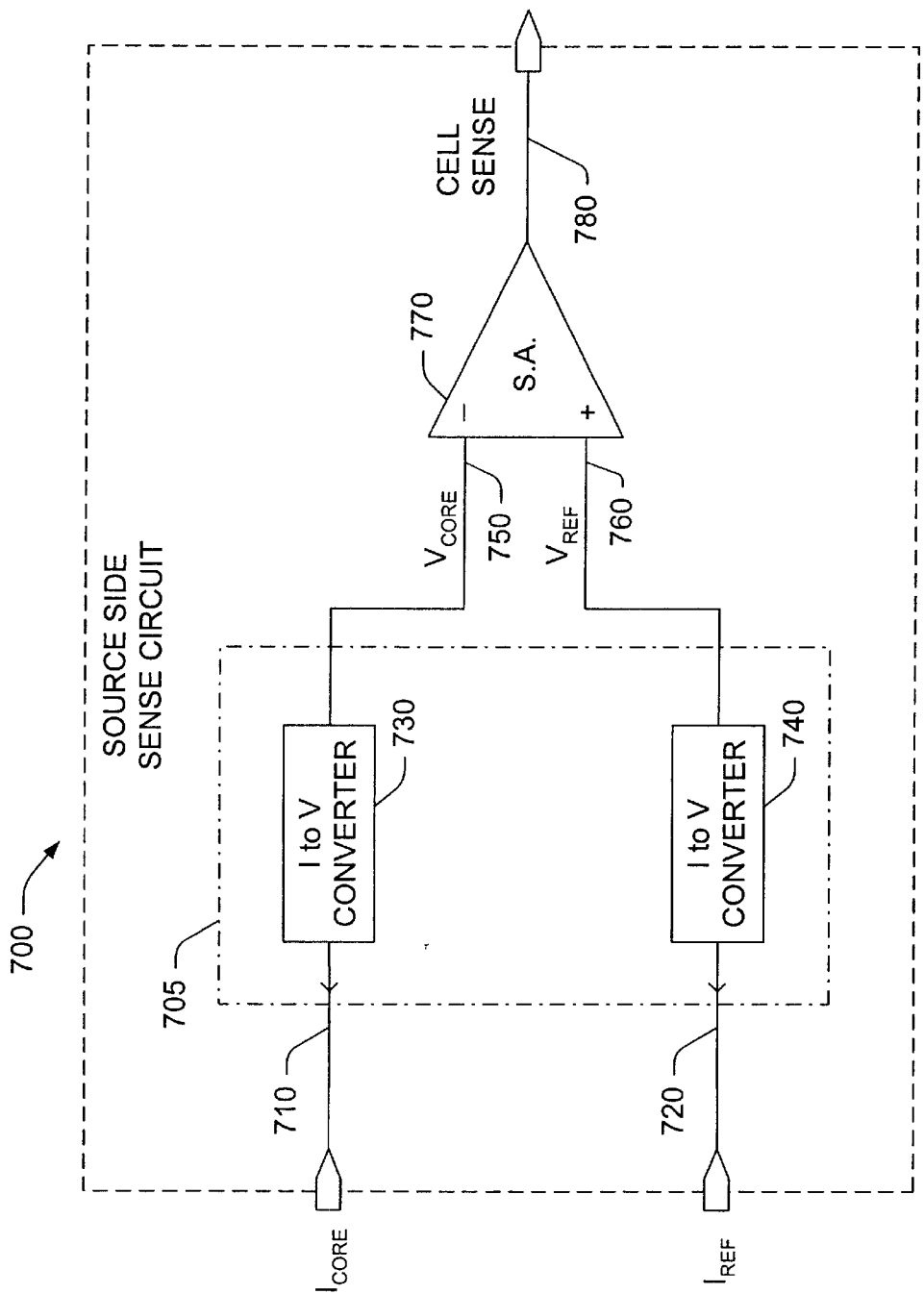
FIG. 10 is a simplified schematic diagram of an exemplary source-side sensing circuit of FIG. 9 in association with an aspect of the present invention.

FIG. 10 is a simplified schematic diagram 700 of the exemplary source-side sensing circuit (e.g., 695 of FIG. 9) in association with an aspect of the present invention. The source-side sense circuit 700 senses the flash cell current, and converts this core cell sense current $I_{CORE}$ 710 to a core cell sense voltage $V_{CORE}$ 750, by the use of a current-to-voltage converter 730. Another current-to-voltage converter 740 within the source-side sense circuit 700 also generates a reference current $I_{REF}$ 720 and converts this to a reference voltage $V_{REF}$ 760, which is compared to $V_{CORE}$ 750 in the sense amplifier 770. The two current-to-voltage converters 730, and 740 may also be combined together in a cascode preamplifier circuit 705 within the source side sense circuit 700.

During reading, this sense voltage $V_{CORE}$ 750 associated with the flash cell sense current $I_{CORE}$ 710, is compared to the reference voltage $V_{REF}$ 760 in the sense amplifier 770 to produce a core cell indication 780 of the correct flash cell logical state.

Figure 11:
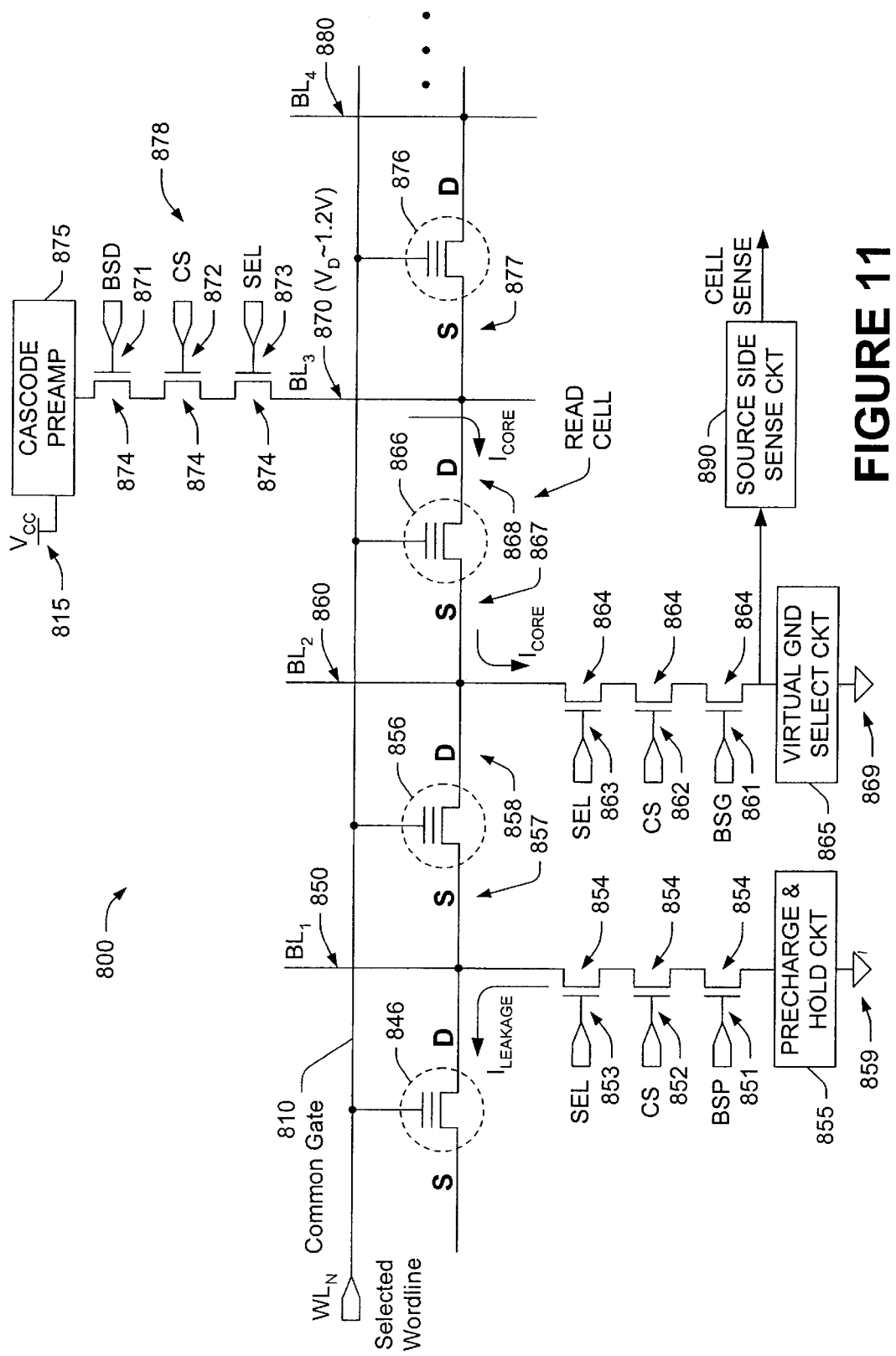
FIG. 11 is a simplified schematic illustration of an exemplary virtual ground array segment with a sensed cell and an adjacent cell, a bitline precharge and hold circuit, cascode preamplifier, virtual ground selection circuit, and source-side sense circuit, in accordance with an aspect of the invention.

To better analyze the operation of the present invention, FIG. 11 is presented, which is a simplified schematic illustration of an exemplary virtual ground array segment 800 with a sensed cell 866 and an adjacent cell 856, a bitline precharge and hold circuit 855, a source side sense circuit 890, a cascode preamplifier 875, a virtual ground selection circuit 865, and a ground 869, in accordance with an aspect of the invention. Exemplary bitline elements $BL_1$ 850, thru $BL_4$ 880, may be selected by drain or source column decode circuits (not shown), along with an exemplary wordline element $WL_n$ 810, to select one or more memory cells 846, 856, 866, 876.

In the circuit 800, according to the present invention, a memory cell 866 is first chosen to be sensed, by selecting two bitlines which bound the drain and source terminals of the cell, and a wordline coupled to the gate terminal of the cell. Specifically, cell 866 is selected by a source bitline $BL_2$ 860, and a drain bitline $BL_3$ 870, and a wordline $WL_n$ 810 coupled to its gate terminal. The adjacent bit memory cell 856, which is adjacent to the source terminal side (source side) of the sensed cell 866, also has a source side bitline $BL_1$ 850, which is also selected along with the source side bitline $BL_2$ 860 for charging to the substantially same precharge voltage $V_{SS}$ (e.g., about 0 volts, or ground), by selectively coupling such voltage to the bitlines 850 and 860.

The cascode amplifier circuit 875 receives the applied $V_{CC}$ power supply voltage (e.g., about 2.6 to 3.6 volts), and converts such voltage to an analog derivative of the $V_{CC}$ applied to bitlines 870 as $V_D$ (e.g., about 1.2 volts) according to one exemplary aspect of the present invention.

A virtual ground is applied to the selected cell 866 by the virtual ground selection circuit 865, and a ground 869. Column Select CS transistors 852, 862, and 872, and Select Line SEL transistors 853, 863, and 873, are used to select the desired drain side and source side bitlines for the memory cells respectively. The Byte Select Precharge BSP transistor 851 selects the application of the precharge and hold circuit 855, while the Byte Select Drain BSD transistor 871 selects the application of the cascode preamplifier 875, and the Bit Select Ground BSG transistor 861 is part of the virtual ground selection circuitry for the source side of the cell to be sensed.

After the drain side and source side virtual ground bitlines are selected for the cell 866 to be sensed, the source side bitline of the adjacent bit cell is selected, and the wordline of the sensed cell is selected. In addition, the precharge and hold circuit 855 is selected with BSP 851, the cascode amplifier circuit 875 is selected with BSD 871, and the virtual ground circuit 865 selects the ground 869, the sense voltage $V_D$ is applied to bitline 870. In the above manner, only selective bitlines are precharged (the bitline coupled to the source of the selected cell 866 to be sensed and the bitline coupled to the source of the adjacent cell 856).

A current path $I_{CORE}$ is established by the cascode preamplifier applying the sense voltage $V_D$ to the drain side bitline 870 through the sensed cell 866 to the source side bitline 860 and to the ground 869. This memory cell sense current $I_{CORE}$, is detected by the source side sense circuitry 890 and converted into a sense voltage $V_{CORE}$ which is used for a memory cell sense indication in the sense amplifier (see 770 of FIG. 10).

In addition to the desired $I_{CORE}$ current path which is sensed by the source side sensing circuit 890, another charge sharing current path $I_{LEAKAGE}$ may exist in the virtual ground architecture 800, flowing from the source side bitline 850 toward other successive memory cells (e.g., cell 846) associated with the selected wordline 810 on the source side of the adjacent bit memory cell 856 as illustrated. As all the cells toward the source side of the adjacent bit memory cell 856 have no voltages applied to their bitlines and are floating, the voltage drops across those cells may produce leakage current paths to those cells. The present invention, however, eliminates leakage thru the adjacent cell, by applying the substantially same $V_{SS}$ voltage to the source side bitline of the adjacent cell and the cell being sensed.

By applying virtually the same voltage $V_{SS}$ (e.g., about 0 volts, or ground), to both the source side bitline 860 of the sensed cell 866 and the source side bitline 850 of the adjacent cell 856, and by holding, or maintaining this same voltage to the sensed cell and the adjacent cell, any leakage currents which may flow from the adjacent bit memory cell 856 toward any other source side cells along the wordline, will have no leakage current effects on the sense current of the core cell $I_{CORE}$. In other words, if there is adjacent cell leakage, the method of the present invention, produces a "don't care" condition pertaining to the cell sense current.

By contrast, in conventional sensing schemes, where the precharge voltage is initially applied to all bitlines and then disconnected from bitlines of the source side adjacent bit, the undesirable charge sharing $I_{LEAKAGE}$ current path flows from the cascode preamplifier 875 via the source side bitline 860 toward the adjacent bit memory cell 856, and to all the other cells associated with the selected wordline 810 on the source side of the sensed cell 866. Therefore, the total sense current which flows from the cascode preamplifier 875 in a conventional arrangement, would be $I_{TOTAL}=I_{CORE}+I_{LEAKAGE}$, and may cause the read sense indication of the logical state of the memory cell to be incorrect or have an increased signal margin.

From another perspective, and according to an exemplary aspect of the present invention, with approximately the same voltage applied to both sides of the adjacent bit memory cell, there is no voltage drop across the adjacent bit, and therefore there can also be no current flow through the adjacent cell which would affect the sense current.

Another notable feature of the present invention relates to the selective source column decode circuitry (652 of FIG. 9), which is operable to select a specific source side bitline of the sensed cell and couple it to the source side sense circuit (695 of FIG. 9, 700 of FIG. 10, or 890 of FIG. 11) and the virtual ground select circuit (690 of FIG. 9, or 865 of FIG. 11), and to select the bitline of the source side adjacent bit memory cell and couple it to the charge and hold circuit (660 of FIG. 9, or 855 of FIG. 10) during a read mode operation.

In another aspect of the invention, the drain column decode circuitry (650 of FIG. 9) is operable to select a specific drain side bitline of the sensed cell and couple it to the cascode preamplifier circuitry (670 of FIG. 9, or 875 of FIG. 11). Thus for a selected memory cell to be read having a source terminal associated with a bitline $BL_X$, the selective source column decode circuitry 652 is operable to select bitlines $BL_X$ and $BL_{X-1}$ for application of a source-side voltage thereto (e.g., about 0 volts, or ground). In addition, for the selected memory cell (which has its source terminal associated with bitline $BL_X$), the drain column decode circuitry 650 is operable to select bitline $BL_{X+1}$ for application of a drain-side $V_D$ cell sense potential thereto (e.g., about 1.2 volts).

Therefore, it has been shown that the scheme of the present invention may be used in virtual ground EPROM memory applications for (e.g., program, erase) memory operations to sense an indication of the flash memory cell logical state, which is substantially independent of charge sharing leakage currents to adjacent cells.

It is seen that the charge sharing leakage current effects are eliminated from the cell sense current, producing memory cell readings which are more accurate with improved read signal margins.

Thus the sensing scheme of the present invention maintains a charge on selected bitlines at a stable voltage just prior to cell current sensing, rather than trying to sample the cell during a dynamic discharge, permitting the read sense current to be stable throughout the sense operation, and to allow the timing of the sense operation to become unimportant. Both of these advantages yield a sensing scheme which produces a more stable output indication, without the variations due to charge sharing leakage currents, or read sense timing. These features find usefulness in easing leakage requirements for manufacturing, and/or where memory cell leakages may be higher, and particularly in multi-bit memory devices where higher signal margins are needed to differentiate between the threshold distribution regions defining the $V_T$ of each bit.

It is also seen that in the present invention, fewer bitlines require precharging in the array for a given sensed memory cell, by contrast to all the bitlines of a sector, or all the bitlines of an entire array for conventional sensing schemes.

The above example has been discussed in conjunction with a traditional single-bit, stacked gate type flash memory cell. Alternatively, the memory cells in a memory device according to the present invention may comprise multi-bit flash memory cell architectures, as may be desired and such alternatives are contemplated as falling within the scope of the present invention.

Figure 12:
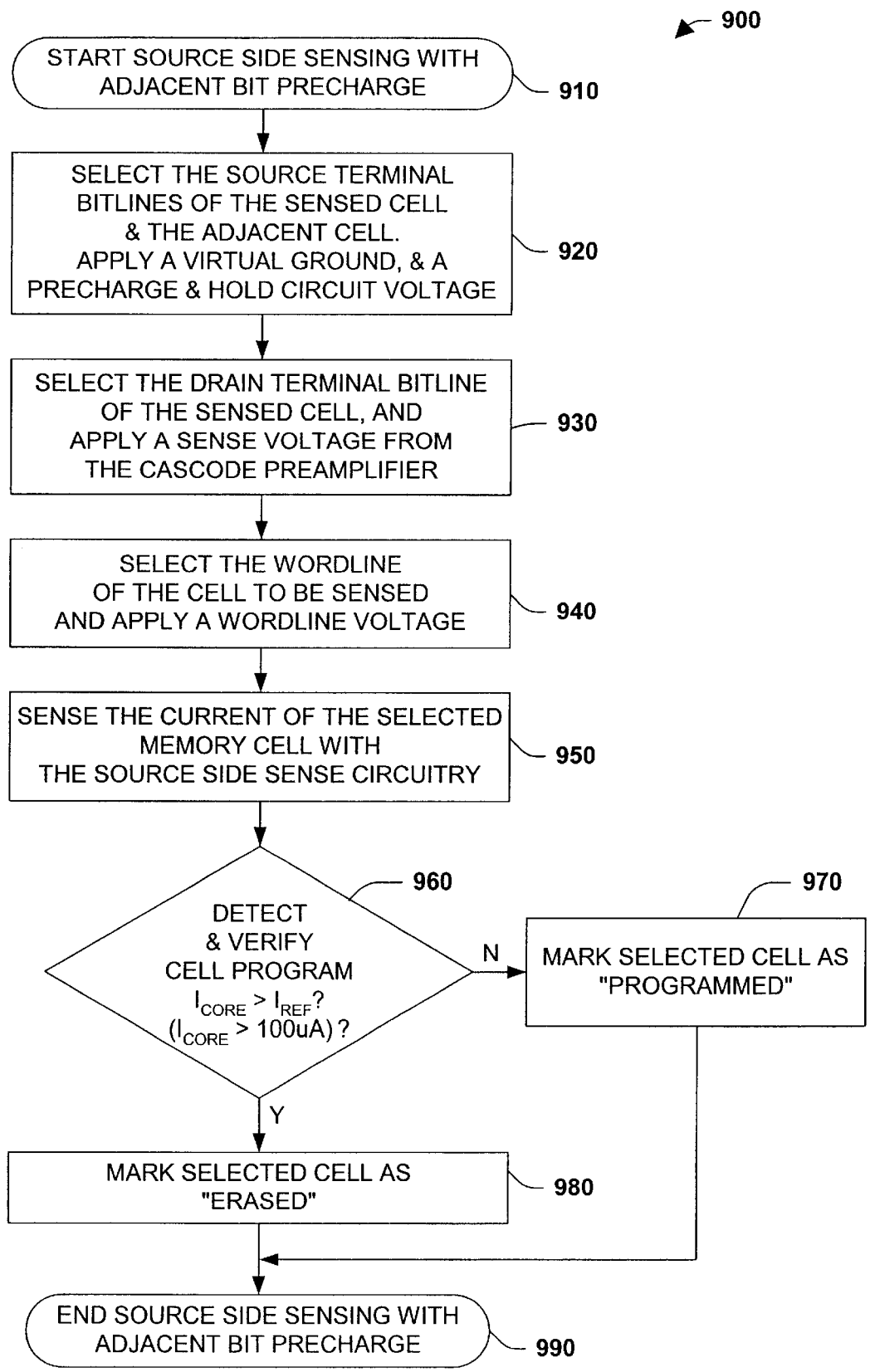
FIG. 12 is a flow diagram illustrating an exemplary method for sensing the state of a virtual ground flash EPROM cell in association with an aspect of the present invention.

Another aspect of the present invention provides a methodology for indicating the logical state of a virtual ground flash memory cell (source-side sensing with adjacent bit precharge) in a read operation in a memory device, which may be employed in association with the memory devices illustrated and described herein, as well as with other memory devices. Referring now to FIG. 12, an exemplary method 900 is illustrated for sensing the state of a virtual ground flash EPROM memory cell in association with an aspect of the present invention. While the exemplary method 900 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 900 may be implemented in association with the apparatus and systems illustrated and described herein as well as in association with other systems not illustrated.

The method 900 comprises selecting a wordline and bitlines associated with a memory cell to be read, and a bitline of an adjacent bit memory cell. The method 900 further comprises applying and holding a voltage to the adjacent cell source bitline which is virtually the same as a precharge voltage applied to the source bitline of the cell to be sensed, and producing a core cell read sense current and associated read sense voltage. The method 900 further comprises producing a reference cell current and associated reference cell voltage, and determining the selected core cell logical state from a comparison of the read sense voltage and the reference voltage, thereby eliminating the charge sharing leakage current variations that would otherwise be reflected in the indication of the memory read sense operation. The virtual ground source side sensing scheme with adjacent bit precharge method begins at step 910. At 920 only the source side bitlines of the cell to be sensed and the adjacent bit memory cell bitline are selected with the selective source column decode circuitry (e.g., $BL_X$ for selected cell and $BL_{X-1}$ for adjacent cell), and a precharge voltage $V_{SS}$ (e.g., about 0 volts, or ground), which is virtually the same as a precharge voltage applied to the bitline of the cell to be sensed, is applied and held to the source side bitlines. At 930, the drain bitline of the cell to be sensed (e.g., $BL_{X+1}$ for cell having source connected to $BL_X$) is selected by the drain column decode select circuitry, and the cascode preamplifier circuit generates a sense voltage $V_D$ (e.g., about 1.2 volts) to the drain bitline of the cell to be sensed. The wordline coupled to the gate of the sensed cell is selected and a wordline voltage is applied at 940. At 950 the sense current $I_{CORE}$ of the selected memory core cell is sensed by the source side sense circuit and converted to a sense voltage $V_{CORE}$ (e.g., 710 and 750 of FIG. 10), which also produces a reference current $I_{REF}$ and converts it to a $V_{REF}$ (e.g., 720 and 760 of FIG. 10). Thereafter the core cell logical state is detected and indicated as an output of a sense amplifier (770 of FIG. 10) from a comparison of the read sense voltage $V_{CORE}$ and the reference voltage $V_{REF}$ at step 960. The output of the sense amplifier results in either a programmed logical state in step 970 if the cell current is not greater than the reference cell current, or an erased or unprogrammed logical state in step 980 if the cell current is greater than the reference cell current. In either event, the source side sensing scheme with adjacent bit precharge operation thereafter ends at 990, and the method 900 may be repeated for subsequent erase or program sense operations of the memory device.

The methodology 900 thus provides for a stable, low leakage, accurate memory cell sense reading in a selective bitline, precharge and hold, and sense circuitry which applies and holds a voltage which is virtually the same as the sensed cell precharge voltage and uses such voltage to eliminate the charge sharing leakage current variations that would otherwise be reflected in the indication of the memory read sense operation. The source side sensing scheme with adjacent bit precharge is thus substantially independent of charge sharing leakage current variations and may be used for erase or program sense operations of virtual ground flash EPROM memory arrays. Other variants of methodologies may be provided in accordance with the present invention, whereby a cell sensing scheme is used to eliminate the effects of cell or bitline leakage currents.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A system for producing an indication of the logical state of a flash memory cell for a virtual ground flash memory architecture, comprising:

a virtual ground flash memory array configured with columns of cells associated with bit lines, and rows of cells of the array associated with word lines for selection of core cells of the array, wherein the drain and source terminals of cells associated with a given word line are coupled in series between respective bit lines, and the gates of the cells are coupled to respective word lines;

a drain bit line circuit operable to generate a drain terminal potential for a drain terminal of a selected memory cell to be sensed;

a core cell sensing circuit which is operable to sense a core cell current at a bit line associated with a source terminal of the selected memory cell to be sensed, and produce an indication of the flash memory cell logical state;

a bit line precharge and hold circuit configured to apply and maintain a source terminal potential to a bit line associated with a source terminal of a cell adjacent to the selected memory cell to be sensed during a read operation, wherein the applied source terminal potential is substantially the same as the bit line voltage applied to the source terminal bit line of the selected memory cell to be sensed; and a selective bit line decode circuit which is operable to select the bit lines of the selected memory cell to be sensed and the bit line of the adjacent cell during memory read operations, wherein applying a voltage to the bit line of the cell adjacent to the cell being sensed, eliminates the charge sharing leakage current which is typically lost to the adjacent memory cell.

2. The system of claim 1, wherein the selective bit line decode circuit comprises a selective source column decode circuit which is operable to select the source terminal bit line of the selected memory cell to be sensed and a source bit line of the adjacent cell during a memory read operation, for application thereto of substantially the same voltage, thereby substantially shorting out the adjacent cell and prohibiting substantially leakage current associated therewith.

3. The system of claim 1, wherein the core cell sensing circuit comprises:

a cascode preamplifier circuit operable to sense a core cell sense current associated with the memory cell to be sensed, to produce a core cell sense output voltage value which is associated with the core cell sense current, to generate a reference cell current associated with the reference cell, and to produce a reference output voltage value which is associated with the reference cell current; and a sense amplifier which produces an indication of the flash memory cell logical state from a comparison of the core cell sense output voltage value and the reference voltage outputs of the cascode preamplifier circuit.

4. The system of claim 1, wherein the selective bit line decode circuit comprises a selective drain column decode circuit which is operable to select the drain bit line of the selected memory cell for application of a drain terminal potential thereto during a memory read operation.

5. The system of claim 4, wherein the drain terminal potential comprises a memory cell sense voltage of about 1.2 volts.

6. The system of claim 1, wherein the selective bit line decode circuit comprises a selective source column decode circuit which is operable to select the source bit line of the selected memory cell for application of a source terminal potential thereto during a memory read operation.

7. The system of claim 6, wherein the source terminal potential comprises a circuit ground potential.

8. A system for reading a flash memory cell in a virtual ground flash memory architecture, comprising:

a virtual ground flash memory array comprising a row of series connected flash memory cells, each having a gate terminal coupled to a common word line, and wherein a source terminal of a flash memory cell in the row is coupled to a drain terminal of an adjacent flash memory cell in the row at a node, and wherein each node in the row is coupled to a separate bit line;

means for identifying a flash memory cell in the virtual ground flash memory array for reading its logic state;

means for coupling a drain terminal voltage to the drain terminal of the identified flash memory cell;

means for coupling a source terminal voltage to the source terminal of the identified flash memory cell; and means for shorting out a flash memory cell which is adjacent to the source terminal of the identified flash memory cell during a read operation of the identified flash memory cell, thereby eliminating substantially leakage current in the adjacent flash memory cell and improving a read accuracy of the identified flash memory cell.

9. The system of claim 8, wherein the means for shorting out the adjacent flash memory cell comprises means for coupling and maintaining a voltage substantially equal to the source terminal voltage to a source terminal of the adjacent flash memory cell during a cell read operation of the identified flash memory cell.

10. A system for reading a flash memory cell, comprising:
   a virtual ground flash memory array comprising a row of series connected flash memory cells, each having a gate terminal coupled to a common word line, and wherein a source terminal of a flash memory cell in the row is coupled to a drain terminal of an adjacent flash memory cell in the row at a node, and wherein each node in the row is coupled to a separate bit line;
   a decode circuit operable to receive data relating to a selected cell for reading data associated therewith, and operable to selectively couple a bit line associated with a drain terminal to a drain terminal read voltage, and a bit line associated with a source terminal of the selected cell to a source terminal read voltage, and further operable to selectively couple a bit line associated with a source terminal of a flash memory cell which is adjacent to the source terminal of the selected cell to a voltage value approximately equal to the source terminal read voltage, thereby substantially shorting out the adjacent cell during a read operation of the selected cell and substantially eliminating leakage current associated therewith.

11. The system of claim 10, wherein the decode circuit further comprises:
   a source side virtual ground select circuit operable to couple the source terminal read voltage to the source terminal of the selected cell; and
   a precharge and hold circuit operable to couple and maintain the voltage value approximately equal to the source terminal read voltage to the source terminal of the adjacent cell during the read operation of the selected cell.

12. The system of claim 10, wherein the decode circuit is operable to maintain remaining bit lines not associated with the selected cell or the adjacent cell in a floating state or a high impedance state, respectively.

13. A method of performing a memory cell current read operation in a virtual ground flash memory device, comprising the step of:

selecting bit lines bounding a cell to be sensed;
selecting a bit line associated with a source terminal of a cell adjacent to the cell to be sensed;
applying a source terminal voltage to the selected bit line coupled to a source terminal of the cell to be sensed;
applying a cell sense voltage to the selected bit line coupled to a drain terminal of the cell to be sensed;
selecting a word line coupled to a gate of the cell to be sensed and applying a read voltage thereto;
applying and holding a precharge voltage to the selected adjacent cell bit line, wherein the precharge voltage is substantially the same voltage as the source terminal voltage applied to the source bit line of the cell to be sensed, thereby substantially shorting out the adjacent cell during a read operation of the cell to be sensed; and
sensing a core cell logical state indication from the core cell sense current on a source side of the cell to be sensed.

14. The method of claim 13, wherein sensing a core cell logical state comprises:
   sensing a core cell sense current with a cascode preamplifier which generates a core cell sense current in association with the memory cell, and produces an output voltage value which is associated with the core cell sense current, and produces a reference cell output voltage which is associated with a reference cell current; and
   producing an indication of the flash memory cell logical state with a sense amplifier which is operable to receive the voltage outputs of the cascode preamplifier, wherein the adjacent cell bit line voltage, which is substantially the same as the precharge voltage applied to the bit line associated with the source terminal of the memory cell, causes the cascode preamplifier output voltages and the sense amplifier indication to be substantially independent of charge sharing leakage currents to adjacent cells.

15. The method of claim 13, further comprising maintaining nonselected bit lines along the word line associated with the cell to be sensed in a floating state or a high impedance state, respectively.

* * * * *